United States Patent
Le Coz et al.

(10) Patent No.: US 8,570,096 B2
(45) Date of Patent: Oct. 29, 2013

(54) TRANSISTOR SUBSTRATE DYNAMIC BIASING CIRCUIT

(75) Inventors: Julien Le Coz, Grenoble (FR);
Alexandre Valentian, Saint Egrève (FR); Philippe Flatresse, Froges (FR);
Sylvain Engels, Meylan (FR)

(73) Assignee: STMicroelectronics SA, Montrouge (FR)

( * ) Notice: Subject to any disclaimer, the term of this patent is extended or adjusted under 35 U.S.C. 154(b) by 36 days.

(21) Appl. No.: 13/232,529

(22) Filed: Sep. 14, 2011

(65) Prior Publication Data

US 2012/0062313 A1 Mar. 15, 2012

(30) Foreign Application Priority Data

Sep. 14, 2010 (FR) ...................................... 10 03656

(51) Int. Cl.
*G05F 1/10* (2006.01)
(52) U.S. Cl.
USPC .......................................... 327/534; 327/544
(58) Field of Classification Search
USPC ...................... 327/534, 535, 537, 544; 326/33
See application file for complete search history.

(56) References Cited

U.S. PATENT DOCUMENTS

| | | | | | |
|---|---|---|---|---|---|
| 3,675,144 | A | * | 7/1972 | Zuk | 330/277 |
| 4,584,491 | A | * | 4/1986 | Ulmer | 326/72 |
| 4,791,321 | A | * | 12/1988 | Tanaka et al. | 326/27 |
| 5,017,811 | A | | 5/1991 | Worley | 307/475 |
| 5,117,131 | A | * | 5/1992 | Ochi et al. | 326/71 |
| 5,276,362 | A | * | 1/1994 | Obregon et al. | 326/65 |
| 5,461,338 | A | * | 10/1995 | Hirayama et al. | 327/534 |
| 5,821,769 | A | * | 10/1998 | Douseki | 326/34 |
| 5,898,235 | A | * | 4/1999 | McClure | 307/64 |
| 6,078,206 | A | * | 6/2000 | Watarai | 327/320 |
| 6,118,328 | A | * | 9/2000 | Morikawa | 327/534 |
| 6,225,852 | B1 | * | 5/2001 | Cleveland et al. | 327/534 |
| 6,404,243 | B1 | * | 6/2002 | Koch et al. | 327/107 |
| 6,429,726 | B1 | | 8/2002 | Bruneau et al. | 327/537 |
| 6,433,624 | B1 | * | 8/2002 | Grossnickle et al. | 327/543 |
| 6,465,849 | B1 | * | 10/2002 | Chang et al. | 257/369 |
| 6,515,534 | B2 | * | 2/2003 | Dabral | 327/534 |
| 6,661,277 | B2 | * | 12/2003 | Dabral | 327/534 |
| 6,768,617 | B2 | * | 7/2004 | Marr | 361/56 |
| 7,274,217 | B2 | * | 9/2007 | Chuang et al. | 326/83 |

(Continued)

FOREIGN PATENT DOCUMENTS

EP 0883052 12/1998

OTHER PUBLICATIONS

Ananthan et al., "Larger-than Vdd forward bias in sub-0.5 V Nanoscale CMOS", Proceedings of the 2004 International Symposim on Low Power Electronics and Design, Nov. 2004, pp. 8-13.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

(Continued)

*Primary Examiner* — Thomas J Hiltunen
(74) *Attorney, Agent, or Firm* — Allen, Dyer, Doppelt, Milbrath & Gilchrist, P.A.

(57) ABSTRACT

A dynamic biasing circuit of the substrate of a MOS power transistor may include a first switch configured to connect the substrate to a current source which forward biases the intrinsic source-substrate diode of the transistor, when the gate voltage of the transistor turns the transistor on. The current source may include a stack of diodes in the same conduction direction as the intrinsic diode between the substrate and a supply voltage.

10 Claims, 2 Drawing Sheets

(56) References Cited

U.S. PATENT DOCUMENTS

| | | | |
|---|---|---|---|
| 7,348,855 B2 * | 3/2008 | Wu | 330/300 |
| 7,598,802 B2 * | 10/2009 | Ito | 327/581 |
| 7,714,638 B2 * | 5/2010 | Ryu et al. | 327/537 |
| 7,952,422 B2 * | 5/2011 | Chuang et al. | 327/534 |
| 2010/0007382 A1 * | 1/2010 | Hashimoto | 326/122 |

OTHER PUBLICATIONS

Kim et al., "An E-TSPC Divide-by-2 Circuit With Forward Body Biasing in 0.25 µm CMOS", IEEE Microwave and Wireless Components Letters, vol. 19, No. 10. Oct. 2009, pp. 656-658.

Tschanz et al., "Dynamic sleep transistor and body bias for active leakage power control of microprocessors", IEEE, vol. 38, No. 11, Nov. 2003, pp. 1838-1845.

* cited by examiner

TRANSISTOR SUBSTRATE DYNAMIC BIASING CIRCUIT

FIELD OF THE INVENTION

The invention relates, in general, to power management systems of an electronic device by selective power-off of temporarily unused electronic macro-functions. The object of the invention is, more particularly, dynamic biasing of the substrate of power transistors used to power macrofunctions off.

BACKGROUND OF THE INVENTION

FIG. 1 schematically represents an electronic architecture of a portable device equipped with a power management system. The electronic architecture is partitioned into several macrofunctions, FCT1, FCT2, etc., able to function independently from one another. In a mobile phone, the macrofunctions can be WiFi connectivity, 3G connectivity, GSM connectivity, playing music, playing videos, FM radio, etc.

Each macrofunction is supplied between a high-voltage line Vdd and a reference line Vss. The Vdd line is distributed to each macrofunction by a respective MOS power transistor MPs controlled in independent manner by a power management circuit, not shown. In this configuration, called a header configuration, where the power transistors are connected to the high-voltage line, the transistors are of P-conductivity type. In a complementary configuration, called a footer configuration, N-conductivity power transistors distribute reference line Vss to the macrofunctions.

Each transistor MPs is dimensioned according to the current consumed by the macrofunction which it supplies. In fact, each transistor MPs is formed by multiple elementary transistors connected in parallel and distributed along a local supply line to the macrofunction. A transistor MPs can be formed by hundreds or even thousands of elementary transistors.

The role of the power management system, in this context, is to detect the unused macrofunctions and to cut off their power supply by means of power transistors MPs until they are next used. These macrofunctions then stop consuming current.

Static consumption may not be completely eliminated, as it depends on the leakage currents of transistors MPs when the latter are in off state. The static consumption then depends on the parameters of transistors MPs, i.e. on the type and dimensioning of the elementary transistors constituting transistors MPs and on the number of elementary transistors. The leakage currents of power transistors MPs in off state are nevertheless several decades lower than the leakage currents of macrofunctions FCT, based upon the technologies used at present for the transistors of macrofunctions FCT.

The leakage current of a MOS transistor can be reduced by increasing the threshold voltage Vt of the transistor, i.e. the minimum gate-source voltage to be applied for the transistor to turn on. It may be known to increase the threshold voltage by reverse biasing the intrinsic diode present between the source and substrate of the transistor, which is referred to as reverse body biasing (RBB). For this, a voltage Vdds is applied to the substrate that is higher than the voltage Vdd for a P-conductivity transistor, and lower than the voltage Vss for an N-conductivity transistor. A third supply voltage may be desirable. In the absence of a third supply voltage, relatively good results are obtained by connecting the substrate to the high supply voltage Vdd for a P-conductivity transistor and to the low supply voltage Vss for an N-conductivity transistor. The intrinsic diode is then biased to zero voltage.

A transistor thus configured to have low leakage in the off state does, on the other hand, present a higher resistance in the on state Ron, which may not be desirable for a power transistor which would then dissipate more power. In the configuration of FIG. 1, the macrofunctions may have a substantially lower supply voltage available than the scheduled supply voltage based upon the larger voltage drop at the terminals of power transistors MPs.

The resistance of a transistor in the on state Ron may be reduced by reducing the transistor threshold voltage Vt. This may be achieved by forward biasing the intrinsic source-substrate diode of the transistor, which is referred to as forward body biasing (FBB). Thus, to have a transistor that presents both low leakage in the off state and a low resistance in the on state, the techniques of RBB and FBB may be combined.

FIG. 2 illustrates an attempt described in the article "Dynamic Threshold-Voltage MOSFET (DTMOS) for Ultra-Low Voltage VLSI," by Fariborz Assaderaghi, Dennis Sinitsky, Stephen A. Parke, Jeffrey Bokor, Ping K. Ko, and Chenming Hu, IEEE TRANSACTIONS ON ELECTRON DEVICES, VOL. 44, NO. 3, MARCH 1997. This article proposes, as represented, to connect the substrate to the transistor gate. Thus, in the represented case of a P-conductivity transistor MP, when the gate voltage increases, tending to turn the transistor off, the bias of the substrate, and therefore the threshold voltage, is increased, which reduces the leakage current. When the gate voltage decreases, tending to turn the transistor on, the intrinsic source-substrate diode (represented in broken lines) is forward biased when the gate voltage drops below Vdd-Vjct, where Vjct is the threshold voltage of the intrinsic diode. This reduces the threshold voltage of the transistor, and therefore the resistance in the on state Ron.

It may be desirable that the gate voltage, on the other hand, not drop very far below Vdd-Vjct, as the intrinsic diode presents a relatively low impedance and may start to conduct a high current from its anode connected to Vdd to its cathode dragged to voltage Vss by the gate control signal. This approach may therefore be reserved for applications with a very low supply voltage (about 0.6 V).

For a higher supply voltage, the above-mentioned article introduces a limiter on the connection between the gate and substrate enabling the gate voltage to vary between Vdd and Vss, while at the same time limiting the substrate voltage to a sufficient value to forward bias the intrinsic diode without drawing too much current. The limiter described uses a generic voltage source, but no practical embodiment of this voltage source is proposed.

The various studies published on forward biasing of the intrinsic source-substrate diode of a transistor (FBB) are in fact theoretical and do not approach any commercially viable embodiment of the voltage source, apart from any provision of an additional external voltage source.

For example, the article "An E-TSPC Divide-by-2 Circuit With Forward Body Biasing in 0.25 μm CMOS," by Seungsoo Kim and Hyunchol Shin, IEEE MICROWAVE AND WIRELESS COMPONENTS LETTERS, VOL. 19, NO. 10. OCTOBER 2009, describes a voltage source provided by a resistor bridge. The surface occupied by the resistor bridge proves to be 100 times larger than the surface of the circuit composed of the transistors whose substrates are biased.

SUMMARY OF THE INVENTION

Thus, a voltage source of a commercially viable structure for a dynamic biasing circuit of a transistor substrate may be desirable. A single dynamic biasing circuit, including its voltage source, to be able to be used for a range of dimensions of power transistors may also be desirable.

These objects may be achieved by a dynamic biasing circuit of the substrate of a MOS power transistor. The dynamic biasing circuit may include a first switch configured to link the substrate to a current source which forward biases the intrinsic source-substrate diode of the transistor, when the gate voltage of the power transistor turns the transistor on. The current source may comprise a stack of diodes in the same conduction direction as the intrinsic diode, between the substrate and a supply voltage.

According to one embodiment, the circuit may comprise a second switch arranged to link the substrate to a reference voltage so that the intrinsic source-substrate diode of the transistor is reverse biased or biased to zero voltage, when the gate voltage of the power transistor turns the transistor off. According to one embodiment, the first switch may comprise a transistor with an opposite conductivity to that of the power transistor. The second switch may comprise a transistor with the same conductivity as the power transistor. The bias circuit may comprise an inverter having an input connected to the gate of the power transistor and an output connected to the gates of the transistors of the first and second switches.

According to one embodiment, the power transistor may be connected to power an electronic macrofunction of an electronic device on or off. The biasing circuit may include means or circuitry for interrupting the current in the diode stack when the macrofunction presents an absence of activity whereas the power transistor is on. According to one embodiment, the diodes of the stack may be produced from transistors having types of conductivity and threshold voltages which are chosen according to the required bias level of the power transistor substrate.

DETAILED DESCRIPTION OF THE PREFERRED EMBODIMENTS

Figure 1:
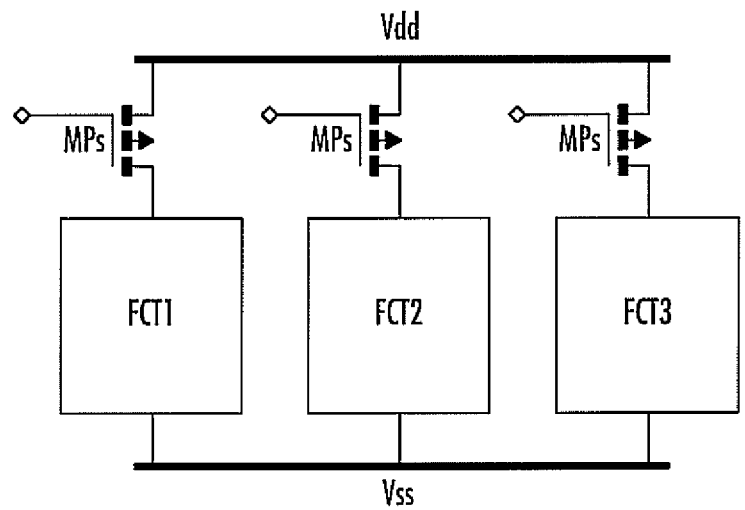
FIG. 1 is a schematic diagram of an architecture of an electron device enabling power management by selective shutdown of macrofunctions as in the prior art.
Figure 2:
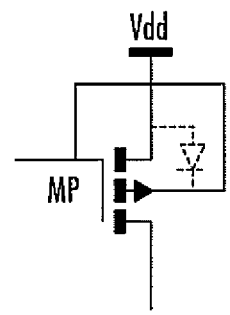
FIG. 2 is a schematic diagram of a circuit for performing dynamic biasing of a transistor substrate as in the prior art.
Figure 3:
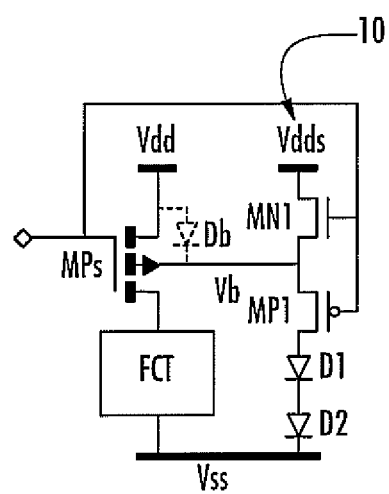
FIG. 3 is a schematic diagram of a dynamic substrate biasing circuit incorporating a bias voltage source in accordance with the present invention.

In FIG. 3, a P-conductivity MOS power transistor MPs is fitted between a macrofunction FCT and a positive supply line Vdd. Macrofunction FCT is further directly connected to reference supply line Vss.

The substrate of transistor MPs is controlled by a dynamic biasing circuit 10. In this embodiment, to operate transistor MPs in the RBB mode, biasing circuit 10 comprises an N-conductivity MOS transistor MN1 linking the substrate of the transistor MPs to a reverse bias voltage Vdds. Preferably, in the represented case of a P-conductivity transistor MPs, voltage Vdds is higher than voltage Vdd. If the device has an additional supply voltage higher than Vdd, which is often the case in portable devices provided with numerous functions, the latter will be used for Vdds. An optimal value Vddopt of voltage Vdds exists. Indeed, above a certain value Vdds=Vddopt>Vdd, the total leakage current starts to increase again. The total leakage current is composed of the leakage current of transistor MPs and of the reverse current of the intrinsic diode. The latter increases linearly as a function of Vdds. When Vdds>Vddopt, even if threshold voltage Vt increases, the total static consumption increases. In the absence of an external voltage source having a voltage comprised between Vdd and Vddopt, voltage Vdd will be able to be used for Vdds.

The gate of transistor MN1 is connected to the gate of transistor MPs. Turn-on of transistor MN1, of opposite conductivity to that of transistor MPs, therefore takes place in phase opposition with that of transistor MPs, i.e. the substrate of transistor MPs is connected to voltage Vdds by transistor MN1 when transistor MPs is off.

For the FBB mode, which may be a preferred embodiment over the RBB mode, for example, the dynamic biasing circuit 10 comprises a P-conductivity MOS transistor MP1 connecting the substrate of transistor MPs to reference voltage Vss via a stack of diodes D1, D2. The gate of transistor MP1 is also linked to the gate of transistor MPs. Turn-on of transistors MPs and MP1 therefore takes place in phase.

When transistor MP1 is on, diode stack D1, D2 forms a diode bridge with source-substrate diode Db of transistor MPs between supply voltages Vdd and Vss. Diodes D1 and D2 are naturally in the same conduction direction as diode Db, their cathodes being directed towards reference voltage Vss.

Diode bridge Db, D1, D2 proves to be particularly well-suited for forward biasing the diode of substrate Db. Additional diodes D1 and D2, each of which can be formed by an elementary transistor, do in fact occupy a small surface. Their non-linear current-voltage characteristic means that they present a low impedance, making bias level Vb of the substrate hardly sensitive to the variation of the size of transistor MPs (or to the number of elementary transistors forming the latter). The same biasing circuit 10 can therefore be used for a whole range of sizes of transistor MPs within which the variability of bias voltage Vb is acceptable. If the size of transistor MPs exceeds the range, a second biasing circuit 10 may be added in parallel with the first. It may thus not be necessary to design the biasing circuit specifically according to the characteristics of the transistor whose substrate is to be biased.

The number of diodes of stack D1, D2 is chosen according to the supply voltage. Two diodes are suitable for a supply voltage of 1.2 V in a 65 nm technology. Each diode, including diode Db, sees a voltage of about 0.4 V and a current of about 10 nA at its terminals. As diode Db is larger than diodes D1 and D2, its internal resistance is in fact lower, and it sees a voltage of less than 0.4 V at its terminals.

If diodes D1 and D2 are formed by transistors MOS connected as a diode, the type of conductivity of the transistors and their threshold voltages can be used to adjust the characteristics of the diode bridge to a value as close to that sought to be achieved.

Figure 4A:
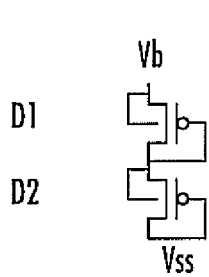
FIGS. 4a to 4d are schematic diagrams of alternative embodiments of the bias voltage source in accordance with the present invention.
Figure 4B:
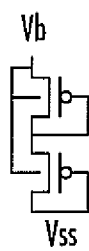
Figure 4C:
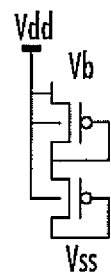
Figure 4D:
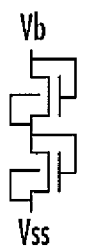

FIGS. 4a to 4d represent four possible configurations of diodes D1 and D2. In FIG. 4a, the diodes are formed by PMOS transistors each of which has its substrate connected to its source. In FIG. 4b, the substrates of the PMOS transistors are both connected to the source of the top transistor, i.e. to voltage Vb. In FIG. 4c, the substrates of the PMOS transistors are connected to voltage Vdd. In FIG. 4d, the diodes are formed by NMOS transistors, each of which has its substrate connected to its source.

The table below illustrates the values obtained by simulation for the different configurations of FIGS. 4a to 4c. Supply voltage Vdd is 1.2 V. Transistor MPs is composed of 8000 elementary transistors, each of which has the parameters W=5 μm and L=0.2 μm in 65 nm CMOS technology. Transistor MPs therefore has a gate width W of 40 mm. Current Id is the drain-source conduction current of transistor MPs. Current Ib is the substrate current of transistor MPs which flows in the diode bridge. The first column corresponds to the case without a substrate biasing circuit (Vbs=0) where the substrate is connected to the source of the transistor and therefore to voltage Vdd. The transistors forming diodes D1 and D2 are of HVt (high Vt) type, with a width W=5 μm and gate length L=0.14 μm.

|    | Vbs = 0 | 4a      | 4b      | 4c      | 4d      |
|----|---------|---------|---------|---------|---------|
| Id | 430 mA  | 510 mA  | 502 mA  | 456 mA  | 515 mA  |
| Ib | 403 pA  | 13.9 nA | 7.16 nA | 1.6 nA  | 21.8 nA |
| Vb | 1.2 V   | 828 mV  | 862 mV  | 1.075 V | 808 mV  |

It can be seen that a variation range of at least 200 mV of bias voltage Vb can be obtained. The best conduction characteristics of transistor MPs are obtained for the lowest voltages Vb (corresponding to the highest forward bias voltages of source-substrate diode Db). The table shows that an improvement of the conductivity of transistor MPs of about 20% can be obtained. This improvement is obtained to the detriment of an increase of current Ib flowing in the diode bridge. A reasonable trade-off between the power gain obtained by increasing the conductivity of transistor MPs and the power dissipated in the diode bridge may be found.

The circuit of FIG. 3, intended to illustrate a general principle, does not offer optimal operation in the RBB mode, i.e. when transistor MN1 is turned-on to bias the substrate of transistor MPs to voltage Vdds. The operating conditions of transistor MN1 are in fact such that it operates as a follower and not as a switch. In other words, its source voltage Vb is equal to its gate voltage Vdd less the threshold voltage of the transistor. It is rather desired for voltage Vb to be equal to voltage Vdds independently from current Ib.

Figure 5:
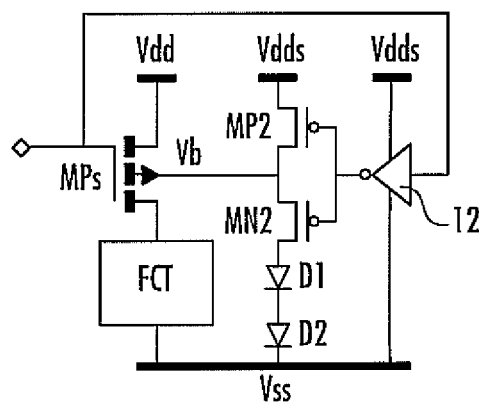
FIG. 5 is a schematic diagram of a dynamic substrate biasing circuit in accordance with another embodiment of the present invention.

FIG. 5 schematically represents an embodiment enabling operation in RBB mode to be optimized. Transistor MN1 has been replaced by a PMOS MP2 and transistor MP1 has been replaced by an NMOS transistor MN2. The transistor gates of transistors MP2 and MN2 are commanded by an inverter 12 supplied between voltages Vss and Vdds, the input of the inverter being linked to the gate of transistor MPs. This configuration enables transistors MP2 and MN2 to operate as switches under most circumstances. As indicated in the foregoing, diode bridge Db, D1, D2 branches off a current which increases if the conductivity of transistor MPs is to be improved.

Figure 6:
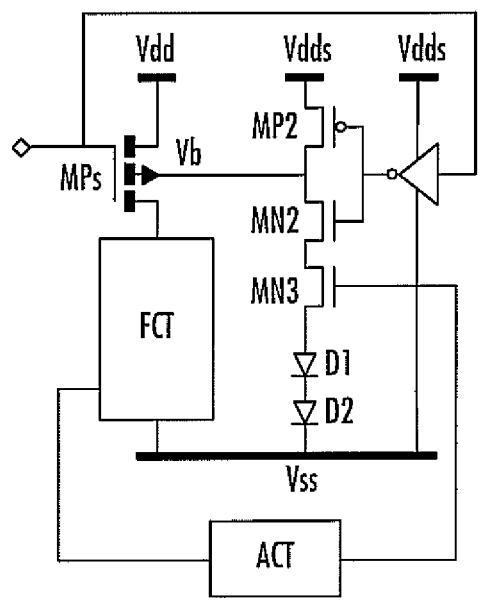
FIG. 6 is a schematic diagram the dynamic biasing circuit of FIG. 5 according to another embodiment of the present invention.

FIG. 6 represents an embodiment wherein the current consumed in the diode bridge may be limited with a reduced impairment of the conductivity of transistor MPs when the latter is optimal. Numerous macrofunctions FCT, when supplied, can nevertheless have periods of inactivity where they are placed in standby state by the power management system. A standby state generally involves local stopping of the clock. During the standby state, it may not be useful for the conductivity of transistor MPs to be optimal.

In FIG. 6, the current in diode stack D1, D2 may be interrupted when a state of inactivity of the macrofunction is detected. For this, a transistor MN3 is, for example, connected in series between transistor MN2 and the diode stack. Transistor MN3 is on under normal circumstances and off when an activity detection circuit ACT determines that macrofunction FCT is inactive, for example, when the power management system has stopped its clock. Transistor MN3 may be controlled by the power management system.

When the current is interrupted in the diode bridge, the substrate of transistor MPs becomes floating, and its voltage is established, by leakage effects, at an equilibrium value between the drain and source voltages of the transistor, close to voltage Vdd. Resistance Ron of transistor MPs therefore increases, but this may have negligible consequences on account of the fact that macrofunction FCT consumes leakage currents in this mode.

Numerous variants and modifications of the embodiments described here will be apparent to the person skilled in the trade. Whereas power transistor MPs whose substrate bias is to be dynamically adjusted has been presented as a PMOS transistor having its source connected to a high supply line Vdd, any other configuration or type of transistor can be envisaged by the person skilled in the trade by adapting the types of elements, the direction of connection, and the number of stacked diodes, in the bias circuit.

That which is claimed:

1. A dynamic biasing circuit for a substrate of a metal oxide semiconductor (MOS) power transistor to be coupled to power an electronic function block on or off, the MOS power transistor comprising an intrinsic source-substrate diode, the dynamic biasing circuit comprising:
   a current source;
   a first switch configured to couple the substrate to said current source so that the intrinsic source-substrate diode is forward biased when a gate voltage of the MOS power transistor turns the MOS power transistor on;
   said current source comprising a stack of diodes between the substrate and a supply voltage and having a same conduction direction as the intrinsic source-substrate diode; and
   interrupt circuitry configured to interrupt current in said stack of diodes when the electronic function block is inactive based upon an associated output signal and when the MOS power transistor is on.

2. The dynamic biasing circuit according to claim 1, further comprising a second switch configured to couple the substrate to a reference voltage so that the intrinsic source-substrate diode is one of reverse biased and biased with a zero voltage when a gate voltage of the MOS power transistor turns the MOS power transistor off.

3. The dynamic biasing circuit according to claim 2, wherein said first switch comprises a transistor of opposite conductivity to that of the MOS power transistor; wherein said second switch comprises a transistor with a same conductivity as that of the MOS power transistor; and further comprising an inverter having an input coupled to a gate of the MOS power transistor and an output coupled to gates of said transistors of said first and second switches.

4. An integrated circuit comprising:
   a substrate;
   a power transistor on said substrate and to be coupled to power an electronic function block on or off, the MOS power transistor having an intrinsic source-substrate diode;

a current source between said substrate and a supply voltage, and comprising a stack of diodes;
a first switch configured to couple said substrate to said current source so that the intrinsic source-substrate diode is forward biased when a control terminal voltage of the power transistor turns the power transistor on; and
interrupt circuitry configured to interrupt current in said stack of diodes when the electronic function block is inactive based upon an associated output signal and when the power transistor is on.

5. The integrated circuit according to claim 4, further comprising a second switch configured to couple the substrate to a reference voltage so that the intrinsic source-substrate diode is one of reverse biased and biased with a zero voltage when a control terminal voltage of the power transistor turns the power transistor off.

6. The integrated circuit according to claim 5, wherein said first switch comprises a transistor of opposite conductivity to that of the power transistor; wherein said second switch comprises a transistor with a same conductivity as that of the power transistor; and further comprising an inverter having an input coupled to a control terminal of the power transistor and an output coupled to control terminals of said transistors of said first and second switches.

7. A biasing method for a substrate of a metal oxide semiconductor (MOS) power transistor coupled to power an electronic function block on or off, the MOS power transistor comprising an intrinsic source-substrate diode, the method comprising:
using a first switch to couple the substrate to a current source so that the intrinsic source-substrate diode is forward biased when a gate voltage of the MOS power transistor turns the MOS power transistor on;
the current source comprising a stack of diodes between the substrate and a supply voltage and having a same conduction direction as the intrinsic source-substrate diode; and
using interrupt circuitry to interrupt current in the stack of diodes when the electronic function block is inactive based upon an associated output signal and when the MOS power transistor is on.

8. The method according to claim 7, further comprising using a second switch to couple the substrate to a reference voltage so that the intrinsic source-substrate diode is one of reverse biased and biased with a zero voltage when a gate voltage of the MOS power transistor turns the MOS power transistor off.

9. The method according to claim 8, wherein the first switch comprises a transistor of opposite conductivity to that of the MOS power transistor; wherein the second switch comprises a transistor with a same conductivity as that of the MOS power transistor; and further comprising coupling an input of an inverter to a gate of the MOS power transistor and an output to gates of the transistors of the first and second switches.

10. The method according to claim 7, wherein the stack of diodes comprises transistors having types of conductivity and threshold voltages; and further comprising choosing the transistors according to a desired bias level of the substrate.

* * * * *